(12) United States Patent
Schwandner

(10) Patent No.: US 9,533,394 B2
(45) Date of Patent: Jan. 3, 2017

(54) METHOD FOR THE LOCAL POLISHING OF A SEMICONDUCTOR WAFER

(75) Inventor: Juergen Schwandner, Garching (DE)

(73) Assignee: Siltronic AG, Munich (DE)

( * ) Notice: Subject to any disclaimer, the term of this patent is extended or adjusted under 35 U.S.C. 154(b) by 1558 days.

(21) Appl. No.: 12/774,163

(22) Filed: May 5, 2010

(65) Prior Publication Data

US 2010/0330883 A1 Dec. 30, 2010

(30) Foreign Application Priority Data

Jun. 24, 2009 (DE) .......................... 10 2009 030 298

(51) Int. Cl.
| | |
|---|---|
| *B24B 1/00* | (2006.01) |
| *B24B 37/04* | (2012.01) |
| *B24B 37/30* | (2012.01) |
| *H01L 21/02* | (2006.01) |

(52) U.S. Cl.
CPC ............. *B24B 37/042* (2013.01); *B24B 37/30* (2013.01); *H01L 21/02021* (2013.01); *H01L 21/02024* (2013.01)

(58) Field of Classification Search
CPC .. B24B 37/042; B24B 37/30; H01L 21/02024; H01L 21/02021
USPC ........ 451/36, 37, 41, 288; 438/690, 691, 692
See application file for complete search history.

(56) References Cited

U.S. PATENT DOCUMENTS

| | | | |
|---|---|---|---|
| 5,374,564 A | 12/1994 | Bruel | |
| 5,779,521 A * | 7/1998 | Muroyama et al. ............ 451/56 | |
| 5,944,590 A | 8/1999 | Isobe et al. | |
| 6,033,292 A | 3/2000 | Inaba | |
| 6,069,080 A | 5/2000 | James et al. | |
| 6,293,850 B1 | 9/2001 | Lin et al. | |
| 6,435,949 B1 | 8/2002 | Katsuoka et al. | |
| 6,506,105 B1 * | 1/2003 | Kajiwara et al. ............. 451/289 | |
| 6,602,117 B1 | 8/2003 | Chopra et al. | |
| 6,790,763 B2 * | 9/2004 | Kondo et al. ................. 438/622 |
| 6,828,225 B2 * | 12/2004 | Kondo et al. ................. 438/622 |
| 6,857,947 B2 * | 2/2005 | Wang et al. ................... 451/296 |
| 6,910,951 B2 * | 6/2005 | Balijepalli et al. ............. 451/41 |
| 6,998,013 B2 * | 2/2006 | Jan et al. .................. 156/345.13 |
| 7,108,592 B2 * | 9/2006 | Fukaya et al. ................ 451/285 |
| 7,112,960 B2 * | 9/2006 | Miller et al. .................. 324/230 |
| 7,207,871 B1 * | 4/2007 | Zuniga et al. ................ 451/288 |
| 7,223,690 B2 * | 5/2007 | Kondo et al. ................. 438/637 |
| 7,250,104 B2 * | 7/2007 | Uzoh et al. ................... 205/655 |
| 7,368,388 B2 * | 5/2008 | Small et al. .................. 438/692 |
| 7,465,214 B2 * | 12/2008 | Togawa et al. .................... 451/1 |
| 7,951,718 B2 * | 5/2011 | Donohoe et al. ............. 438/692 |
| 7,988,537 B2 * | 8/2011 | Togawa et al. ............... 451/288 |
| 2004/0069406 A1 | 4/2004 | Jan et al. | |
| 2005/0227590 A1 | 10/2005 | Sung | |
| 2006/0202310 A1 | 9/2006 | Murphy et al. | |
| 2007/0181534 A1 * | 8/2007 | Kamimura ...................... 216/88 |
| 2009/0029552 A1 | 1/2009 | Schwandner et al. | |

FOREIGN PATENT DOCUMENTS

| | | |
|---|---|---|
| CN | 1440321 A | 9/2003 |
| DE | 102007035266 A1 | 1/2009 |
| EP | 0533551 A1 | 3/1993 |
| EP | 1029633 A1 | 8/2000 |
| EP | 2065132 A2 | 6/2009 |
| JP | 2006-043873 A | 2/2006 |
| JP | 2007-073796 A | 3/2007 |
| JP | 2007-243221 A | 9/2007 |
| JP | 2008229846 A | 10/2008 |
| JP | 2009131920 A | 6/2009 |
| WO | 9213680 | 8/1992 |
| WO | 01/87541 A2 | 11/2001 |
| WO | 03003430 A2 | 1/2003 |

\* cited by examiner

*Primary Examiner* — Joseph J Hail
*Assistant Examiner* — Joel Crandall
(74) *Attorney, Agent, or Firm* — Brooks Kushman P.C.

(57) ABSTRACT

The edge region of one side of a semiconductor wafer is polished by pressing the wafer by means of a rotatable polishing head against a polishing pad lying on a rotating polishing plate, and containing fixed abrasive. The polishing head is provided with a resilient membrane radially subdivided into a plurality of chambers by gas or liquid cushions, the polishing pressure independently selectable for each chamber. The wafer is held in position during polishing by a retainer ring pressed against the polishing pad with an application pressure, a polishing agent is introduced between the wafer and the polishing pad, and the polishing pressure exerted on the wafer in a chamber lying in the edge region of the wafer of the polishing head, and the application pressure of the retainer ring, are selected so that material is essentially removed only at the edge of the wafer.

16 Claims, 1 Drawing Sheet

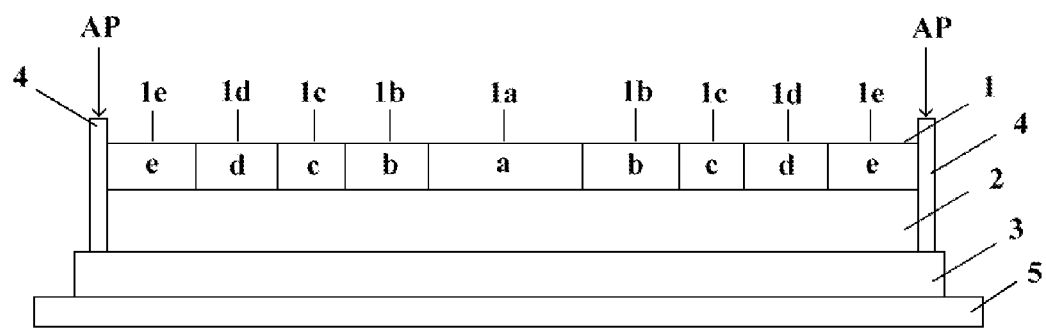
PRIOR ART

METHOD FOR THE LOCAL POLISHING OF A SEMICONDUCTOR WAFER

CROSS-REFERENCE TO RELATED APPLICATIONS

This application claims the benefit of German Patent Application No. DE 10 2009 030 298 filed Jun. 24, 2009 which is herein incorporated by reference.

BACKGROUND OF THE INVENTION

1. Field of the Invention

The invention relates to a method for locally polishing a semiconductor wafer.

2. Background Art

Semiconductor wafers conventionally used include silicon wafers, substrates with layer structures such as SiGe (silicon-germanium) derived from silicon, or SOI, SGOI or GeOI wafers. These semiconductor wafers, particularly SOI and SiGe wafers, are intended for the most demanding of applications, in particular for the production of ultramodern microprocessors.

SOI ("silicon on insulator") wafers are generally produced by transferring a silicon wafer from a so-called "donor wafer" to a supporting wafer ("handle wafer" or "base wafer"). Methods for producing SOI wafers by means of transferring a silicon wafer are known, for example, by the names Smart Cut® (EP 533551 A1) or Genesis Process®. Another method is described in WO 03/003430 A2. SOI wafers comprise a supporting wafer and a silicon cover layer ("top layer" or "device layer") which is connected to the latter and represents the so-called active layer that is intended for the production of electronic components. Either the complete supporting wafer consists of an electrically insulating material such as glass or sapphire, or the silicon cover layer is connected to the supporting wafer via an electrically insulating interlayer, for example consisting of silicon oxide (in which case the interlayer is referred to as a "buried oxide layer", BOX). In the latter case the supporting wafer does not have to be an insulator, and it may for example be a semiconductor wafer, preferably a silicon wafer.

In the prior art, besides the transfer method described above, SOI ("silicon on insulator") structures are also conventionally produced by means of the so-called SIMOX ("separation by ion implantation of oxygen") process. In the SIMOX method, oxygen is implanted at high doses into a silicon substrate which is subsequently heat-treated and oxidized at high temperatures (>1200° C.) in order to generate a buried oxide layer in the silicon substrate.

Similarly, SIMOX and layer transfer methods are also suitable for the production of SGOI ("silicon/germanium on insulator") and/or GeOI ("germanium on insulator") structures.

SiGe layers with a high proportion of germanium, also referred to as virtual substrates, are employed inter alia for the production of biaxially strained silicon. The strain of the silicon lattice leads to an increased mobility of charge carriers, and is used in particular to make CMOS components available which have better performance than those having an unstrained silicon channel.

Virtual substrates may in principle be deposited directly on a monocrystalline silicon substrate, for example a silicon semiconductor wafer. With this procedure, however, defects such as misfit dislocations and threading dislocations are formed in large numbers. Threading dislocations and their accumulations ("pile-ups") extend to the surface of the virtual substrate and also to the surface of a strained layer of silicon deposited on the virtual substrate. Attempts have therefore been made to find a way of limiting the density of threading dislocations and their pile-ups. Such limitation can be achieved by initially depositing a graded SiGe buffer layer, in which the atomic fraction of germanium increases linearly ("linear grading") or in the steps ("terrace grading"). An SiGe layer with a constant germanium content is finally deposited on the SiGe buffer layer, and in the relaxed state forms the virtual substrate.

The semiconductor wafers described here must also satisfy the most stringent of requirements in terms of their geometry. Essentially, the requirements are given by the internationally agreed "Technology Roadmap for Semiconductors" (ITRS), which is subject to an annual review. For example the 22 nm technology, which places increased requirements on geometry, planarity, nanotopology etc., is currently in development. In each case, the aim of the next technology generation (the 22 nm technology will be followed by the 16 nm design rule) is higher switching speeds, higher clock rates and higher integration densities of the microelectronic components. The production methods have to accommodate these increased requirements, so that all the wafer fabrication steps must be adapted accordingly and often replaced by other, new processes.

SiGe and SOI wafers, which are expected to become very important in the future, entail additional problems which the present invention addresses.

In the layer transfer method described above, the donor wafer employed should conventionally be reusable. After separation of the donor wafer, however, steps are found at the edge of the wafer which would need to be eliminated before reusing the wafer (in order to transfer a further silicon layer).

In SiGe technology, the problem arises that there is also SiGe on the frontside of a wafer which is coated with heavily doped SiGe on its backside. When depositing epitaxial layers, material is often also deposited on the side which is not to be coated. This may even occur during the conventional deposition of an epitaxial Si layer on an Si wafer, which in this case is observable as thickening at the edge.

Furthermore, many semiconductor wafers exist in concavely or convexly polished form. An example which may be mentioned here is a wafer being thicker at the edge than in its inner region, or at the center of the wafer.

In the described cases, it would be desirable to eliminate these edge steps, the undesired coating in the edge region or the undesired thickness increase in the edge region.

SUMMARY OF THE INVENTION

An object of the invention is to selectively eliminate undesired edge steps, coating in the edge region, and thickness increase in this region. This and other objects are achieved by a method for locally polishing one side of a semiconductor wafer, in which the semiconductor wafer surface to be polished is pressed, by means of a rotatable polishing head, against a polishing pad lying on a rotating polishing plate and containing firmly bound abrasive, wherein the polishing head is provided with a resilient membrane and radially subdivided into a plurality of chambers by means of gas or liquid cushions, the exerted polishing pressure independently selectable for each chamber. The semiconductor wafer is held in position during polishing by a retainer ring which is likewise pressed against the polishing pad with an application pressure, and a polishing agent is introduced between the semiconductor wafer and the polishing pad. The polishing pressure exerted on the semiconductor wafer by a chamber lying in the edge region of the semiconductor wafer of the polishing head, and the application pressure of the retainer ring, are selected so that material is essentially removed only at the edge of the semiconductor wafer.

BRIEF DESCRIPTION OF THE DRAWINGS

FIG. 1 is a schematic illustrating the subject invention.

DETAILED DESCRIPTION OF THE PREFERRED EMBODIMENT(S)

Basically, the semiconductor wafers are pressed with their side surface to be polished against the polishing pad lying on a polishing plate with the aid of a "polishing head". A polishing head also comprises a "retainer ring", which encloses the substrate laterally and prevents it from sliding off the polishing head during the polishing. Thus, in order to prevent the wafer from sliding out of the polishing head because of the transverse forces which occur during polishing, the wafers are held in position by such retainer rings. These devices are well known, and are described in various patents (U.S. Pat. No. 6,293,850 B1; U.S. Pat. No. 6,033,292; EP 1029633 A1; U.S. Pat. No. 5,944,590). In the present method, the retainer rings are likewise pressed more or less firmly onto the polishing pad.

In the polishing heads used here (carriers), the semiconductor wafer's side surface facing away from the polishing pad bears on a resilient membrane which transmits the polishing pressure being exerted. The membrane is a component of a chamber system, preferably subdivided into five zones, which is formed by a gas or liquid cushion.

The pressure chambers are preferably arranged concentrically or in segmented fashion, and a pressure can be applied to them independently of one another. Finally, the polishing pressure is transmitted through resilient bearing surfaces of the pressurized pressure chambers onto the backside of a supporting plate.

The polishing pressure is preferably controlled over the diameter of the semiconductor wafer in concentric circles by means of concentrically arranged pressure chambers. In this way, a defined polishing pressure can be applied in particular to a radial subregion at the edge of the semiconductor wafer to be polished.

The carrier contains annular, concentrically arranged pressure chambers with a radius respectively reduced by the ring width, from the outside inward. The ring width is preferably from 1 to 100 mm and more preferably from 10 to 50 mm. Preferably, the entire surface of the holding plate is occupied by such pressure chambers. The polishing of the substrate is carried out while supplying a polishing agent between the substrate and the polishing pad and by rotating the polishing head and the polishing plate. In addition, the polishing head may also be moved in translation over the polishing pad so that more comprehensive use of the polishing pad surface is achieved.

In the method according to the invention, a polishing pad which contains an abrasive substance bound in the polishing pad is used (FAP or FA pad). Suitable abrasive substances preferably comprise particles of oxides of the elements cerium, aluminum, silicon or zirconium, or particles of hard substances such as silicon carbide, boron nitride or diamond. Corresponding polishing pads are described, for example, in U.S. Pat. No. 6,602,117 B1. The particle size is preferably 0.1-1.0 µm, more preferably 0.1-0.6 µm and most preferably 0.1-0.25 µm.

Particularly suitable polishing pads have a surface topography containing replicated microstructures. These microstructures ("posts") have, for example, the shape of columns with a cylindrical or polygonal cross section or the shape of pyramids or pyramid frustums. Further descriptions of such polishing pads are contained, for example, in WO 92/13680 A1 and US 2005/227590 A1.

The method according to the invention may be carried out equally well on single-plate and multi-plate polishing machines. It is preferable to use multi-plate polishing machines with preferably two, more particularly preferably three polishing plates and polishing heads. The AMAT Reflection multi-plate polishing machine from Applied Materials, Inc is particularly well-suited. What is essential to the invention is that the polishing machine allows the pressure profile of the carrier to be adjusted differently in different zones. This is the case with the AMAT Reflection, which comprises a 5-zone membrane carrier with a differently adjustable pressure profile.

The invention is directed to locally limited polishing, which substantially affects only the edge region. To this end, a 5-zone membrane carrier with a touching, non-decoupled retainer ring is used in conjunction with a polishing pad containing firmly bound abrasive.

The invention also relates to a locally acting ultrafine grinding method based on bound abrasive. The desired locally limited removal can only be achieved by corresponding pressurization of the membrane carrier in conjunction with a very hard FAP pad (polishing pad or grinding pad). With soft polishing pads such as are used in CMP, conversely, the invention would not be successful even when setting an appropriate pressure profile of the carrier.

The invention makes it possible to locally polish the outer edge region of the semiconductor wafer and is advantageous in particular for semiconductor wafers with a diameter of greater than or equal to 300 mm, particularly for semiconductor wafers with a diameter of 450 mm. The invention can be implemented on customary polishing equipment. It is not necessary to refit commercial polishing machines or provide additional equipment in order to carry out the invention.

FIG. 1 illustrates the method and apparatus used in the present invention in section. The wafer 2 lies on fixed abrasive polishing pad 3 and is restrained by retaining ring 4. Above the wafer is a resilient membrane 1 subdivided into concentric pressurizing chambers 1a, 1b, 1c, 1d, and 1e, which are independently adjustable to apply different pressures against the backside of wafer 2 in areas below chambers 1a-1e. The chambers 1a-1e contain gas or liquid cushions a, b, c, d, and e. The retaining ring is pressed against the polishing pad by application pressure AP. The chamber lying on the edge region is chamber 1e. The polishing pad lies on rotating polishing plate 5.

EXAMPLES

A polishing machine of the AMAT Reflection type was used for the examples. As the polishing pad, a polishing pad with firmly bound cerium oxide particles was used (particle size 0.2 µm). SiGe wafers with a diameter of 300 mm, which had edge steps, were processed according to the invention.

The following polishing parameters are suitable for achieving increased material removal at the edge of the semiconductor wafer, for example so as to remove edge steps:

Example 1

Polishing agent: alkaline solution $K_2CO_3$ 0.2 wt. %;
Volume flow rate of the polishing agent: 0.5 l/min;
Plate rotation speed: 119 rpm;
Carrier rotation speed: 123 rpm;
Retainer ring application pressure: 0.8 psi;
Pressure profile of membrane zones 1 to 5: 0.1-0.1-0.1-0.1-5 [psi]

Example 2

Polishing agent: alkaline solution $K_2CO_3$ 0.2 wt. %;
Volume flow rate of the polishing agent: 0.5 l/min;
Plate rotation speed: 119 rpm;
Carrier rotation speed: 123 rpm;
Retainer ring application pressure: 4.7 psi;
Pressure profile of membrane zones 1 to 5: 1-2-2-2-6 [psi]

Example 3

Polishing agent: alkaline solution $K_2CO_3$ 0.2 wt. %;
Volume flow rate of the polishing agent: 0.5 l/min;
Plate rotation speed: 119 rpm;
Carrier rotation speed: 123 rpm;
Retainer ring application pressure: 6.1 psi;
Pressure profile of membrane zones 1 to 5: 1.5-2-3-3-3.5 [psi]

Zones 1 to 5 correspond to concentric rings from the inside outward: Zone 1=innermost zone, zone 5 outer zone (edge region).

The retainer ring application pressure is preferably 0.5-10 psi in the method according to the invention, and the pressure in chamber 5 (zone 5) is preferably always higher than in zones 1 to 4.

In all three examples, the same polishing agent and the same volume flow rate of the polishing agent were used.

A low retainer application pressure of 0.8 psi was selected in Example 1, while, at 5 psi, the polishing pressure in zone 5 of the carrier was selected to be much higher than in zones 1 to 4.

Examples 2 and 3 use a higher retainer application pressure, but a less pronounced pressure difference between zone 5 and the four inner zones.

Examples 2 and 3 lead to very pronounced, sharp material removal at the outermost edge of the semiconductor wafer, which is made wider than in Example 1.

If material is intended to be removed only at the outer edge of the semiconductor wafer, then a low retainer ring application pressure of less than or equal to 1.5 psi is preferred in combination with a polishing pressure in zone 5 increased significantly relative to the inner zones.

If the material removal is intended to be made wider, i.e. to cover a larger region of the wafer edge, then the selection of a high retainer pressure of greater than or equal to 4 psi is preferred.

All the SiGe wafers polished according to Examples 1 to 3, which previously had edge steps, were free from edge steps after polishing.

The invention was tested on silicon wafers which were thicker at the edge than at the center of the wafer. Silicon wafers often exist in such a form after DSP. It was possible to show that such wafers can be planarised globally by the local polishing or selective polishing according to the invention, with stronger material removal at the edge than at the center of the wafer. The invention can therefore advantageously be applied to silicon wafers, SiGe wafers and SOI wafers. The invention is not restricted thereto, however, and may also be used for local selective polishing of other semiconductor wafers for which locally increased material removal is desired.

Lastly, it should be mentioned that selective material removal at the edge is described and claimed. The invention may however also be used similarly for local polishing in the inner zones of the semiconductor wafer, should the need for this arise in the future.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for locally polishing one side of a semiconductor wafer, comprising pressing the semiconductor wafer by means of a rotatable polishing head against a polishing pad lying on a rotating polishing plate and containing firmly bound abrasive, wherein the polishing head is provided with a resilient membrane concentrically subdivided into a plurality of chambers individually pressurizable by means of gas or liquid cushions, and the exerted polishing pressure is independently selectable for each chamber, wherein the semiconductor wafer is held in position during polishing by a retainer ring which is also pressed against the polishing pad with an application pressure, introducing a polishing agent between the semiconductor wafer and the polishing pad, and selecting the polishing pressure exerted on the semiconductor wafer in a chamber lying in the edge region of the semiconductor wafer of the polishing head, and selecting the application pressure of the retainer ring, such that material is essentially removed only at the edge of the semiconductor wafer.

2. The method of claim 1, wherein the polishing agent comprises an aqueous solution of the compounds sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any mixtures thereof.

3. The method of claim 2, wherein the pH of the polishing agent solution is from 11.0 to 12.5 and the proportion of the compounds in the polishing agent solution is from 0.01 to 10 wt. %.

4. The method of claim 1, wherein the polishing pad contains abrasive substances comprising particles of oxides of the elements cerium, aluminum, silicon or zirconium, or particles of hard substances silicon carbide, boron nitride or diamond.

5. The method of claim 1, wherein the polishing pad contains abrasive with a particle size of 0.1-1.0 µm.

6. The method of claim 5, wherein the polishing pad contains abrasive with a particle size of 0.1-0.6 µm.

7. The method of claim 5, wherein the polishing pad contains abrasive with a particle size of 0.1-0.25 µm.

8. The method of claim 1, wherein the retainer ring application pressure is 0.5-10 psi.

9. The method of claim 1, wherein pressure in an outer chamber is higher than the pressure in an inner chamber.

10. The method of claim 1, wherein the semiconductor wafer is a monocrystalline silicon wafer or a wafer comprising an SiGe layer, with a diameter of 300 mm or more.

11. The method of claim 1, wherein the polishing pad has replicated microstructures on the surface of the polishing pad.

12. The method of claim 11, wherein the replicated microstructures comprise columns with a cylindrical or polygonal cross section.

13. The method of claim 11, wherein the replicated microstructures have the shape of pyramids or pyramid frustrums.

14. The method of claim 1, wherein the semiconductor wafer is a donor wafer from which a transfer layer has been removed.

15. The method of claim 1, wherein the semiconductor wafer is an SiGe wafer.

16. The method of claim 1, wherein the semiconductor wafer has a raised step around the circumference of the wafer.

* * * * *